(12) United States Patent
Kawada et al.

(10) Patent No.: US 11,888,035 B2
(45) Date of Patent: Jan. 30, 2024

(54) SILICON CARBIDE SEMICONDUCTOR DEVICE

(71) Applicant: FUJI ELECTRIC CO., LTD., Kanagawa (JP)

(72) Inventors: Yasuyuki Kawada, Matsumoto (JP); Aki Takigawa, Hachioji (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 258 days.

(21) Appl. No.: 17/385,985

(22) Filed: Jul. 27, 2021

(65) Prior Publication Data
US 2022/0069089 A1 Mar. 3, 2022

(30) Foreign Application Priority Data

Sep. 1, 2020 (JP) .................................. 2020-147099

(51) Int. Cl.
*H01L 29/04* (2006.01)
*H01L 29/26* (2006.01)
*H01L 29/78* (2006.01)
*H01L 21/66* (2006.01)

(52) U.S. Cl.
CPC ............ *H01L 29/263* (2013.01); *H01L 22/12* (2013.01); *H01L 29/04* (2013.01); *H01L 29/7813* (2013.01)

(58) Field of Classification Search
CPC ..... H01L 29/7813; H01L 29/04; H01L 22/12; H01L 29/263
See application file for complete search history.

(56) References Cited

U.S. PATENT DOCUMENTS

| | | | |
|---|---|---|---|
| 2012/0028052 A1* | 2/2012 | Chu ....................... | B82Y 30/00 428/428 |
| 2012/0112164 A1* | 5/2012 | Chu .................. | H01L 21/02447 257/E29.069 |
| 2013/0020585 A1* | 1/2013 | Ishibashi ................ | B28D 5/045 438/510 |
| 2015/0303271 A1* | 10/2015 | Tanaka .................. | H01L 29/517 257/77 |
| 2017/0141223 A1* | 5/2017 | Hoshi ..................... | H01L 29/36 |
| 2018/0097069 A1* | 4/2018 | Utsumi ............... | H01L 29/1608 |
| 2018/0197947 A1* | 7/2018 | Iwaya .................... | H01L 29/063 |
| 2020/0343345 A1 | 10/2020 | Utsumi | |
| 2021/0130650 A1* | 5/2021 | Liao ..................... | C09K 3/1454 |

FOREIGN PATENT DOCUMENTS

JP 6648852 B1 2/2020

* cited by examiner

*Primary Examiner* — Jay C Chang
*Assistant Examiner* — Siangluai Mang

(57) ABSTRACT

The silicon carbide semiconductor device includes: a silicon carbide layer; a silicon dioxide layer provided above the silicon carbide layer and containing nitrogen; and a transition region arranged between the silicon carbide layer and the silicon dioxide layer, and containing carbon, oxygen, and nitrogen, wherein the maximum nitrogen concentration in the transition region is $1.0 \times 10^{20}$ cm$^{-3}$ or higher. The maximum nitrogen concentration in the transition region is five or more times higher than the maximum nitrogen concentration in the silicon dioxide layer.

16 Claims, 14 Drawing Sheets

SILICON CARBIDE SEMICONDUCTOR DEVICE

The contents of the following Japanese patent application are incorporated herein by reference:
NO. 2020-147099 filed in JP on Sep. 1, 2020.

BACKGROUND

1. Technical Field

The present invention relates to a silicon carbide semiconductor device.

2. Related Art

A silicon carbide semiconductor device including a silicon dioxide layer formed on a silicon carbide layer is known. (See, e.g., Patent Document 1.)
Patent Document 1: Japanese Patent No. 6648852

SUMMARY

Problems to be Solved by the Invention

In a silicon carbide semiconductor device, it is preferred to reduce defects on the interface between a silicon carbide layer and a silicon dioxide layer.

Technical Solution

A first aspect of the present invention provides a silicon carbide semiconductor device. The silicon carbide semiconductor device may have a silicon carbide layer. The silicon carbide semiconductor device may have a silicon dioxide layer. The silicon dioxide layer may be provided above the silicon carbide layer. The silicon dioxide layer may contain nitrogen. The silicon carbide semiconductor device may have a transition region. The transition region may be arranged between the silicon carbide layer and the silicon dioxide layer. The transition region may contain carbon, oxygen, and nitrogen. The maximum nitrogen concentration in the transition region may be $1.0 \times 10^{20}$ cm$^{-3}$ or higher.

The maximum nitrogen concentration in the transition region may be five or more times higher than the maximum nitrogen concentration in the silicon dioxide layer.

The maximum nitrogen concentration in the silicon dioxide layer may be higher than the maximum nitrogen concentration in the silicon carbide layer.

A full width at half maximum of the maximum nitrogen concentration in the transition region may be 1.0 nm or less.

The transition region may have a thickness of 3 nm or more. The transition region may have a thickness of 5 nm or less.

The silicon carbide layer may have a strained silicon carbide layer. The strained silicon carbide layer may be provided below the transition region. The strained silicon carbide layer may be defined using the LEED analysis. The silicon carbide layer may have a crystalline silicon carbide layer. The crystalline silicon carbide layer may be provided below the strained silicon carbide layer.

The transition region may have a modified silicon dioxide layer. The modified silicon dioxide layer may be provided below the silicon dioxide layer. The transition region may have a mixed layer. The mixed layer may be provided below the modified silicon dioxide layer. The transition region may have a modified silicon carbide layer. The modified silicon carbide layer may be provided below the mixed layer. The maximum carbon concentration may be higher in the order of the modified silicon carbide layer, the mixed layer, and the modified silicon dioxide layer. The maximum oxygen concentration may be higher in the order of the modified silicon dioxide layer, the mixed layer, and the modified silicon carbide layer. The maximum nitrogen concentration may be higher in the order of the mixed layer, the modified silicon dioxide layer, and the modified silicon carbide layer.

The modified silicon carbide layer may have a nitrided imperfect silicon carbide layer. The nitrided imperfect silicon carbide layer may be provided below the mixed layer. The modified silicon carbide layer may have an imperfect silicon carbide layer. The imperfect silicon carbide layer may be provided below the nitrided imperfect silicon carbide layer. The imperfect silicon carbide layer may not contain nitrogen. The modified silicon carbide layer may have an amorphous silicon carbide layer. The amorphous silicon carbide layer may be provided below the imperfect silicon carbide layer. The amorphous silicon carbide layer may not contain oxygen. The modified silicon dioxide layer may have a carbon-containing imperfect silicon dioxide layer. The carbon-containing imperfect silicon dioxide layer may be provided above the mixed layer. The modified silicon dioxide layer may have an imperfect silicon dioxide layer. The imperfect silicon dioxide layer may be provided above the carbon-containing imperfect silicon dioxide layer. The imperfect silicon dioxide layer may not contain carbon.

The silicon carbide layer may have a trench provided therein. The silicon dioxide layer may be formed in the trench.

The summary clause does not necessarily describe all necessary features of the embodiments of the present invention. The present invention may also be a sub-combination of the features described above.

DESCRIPTION OF EXEMPLARY EMBODIMENTS

While the present invention will be described below by means of the embodiments, these embodiments below are not intended to limit the invention defined by the claims. All combinations of features set forth in the embodiments are not necessarily essential to the solutions of the present invention.

Figure 1:
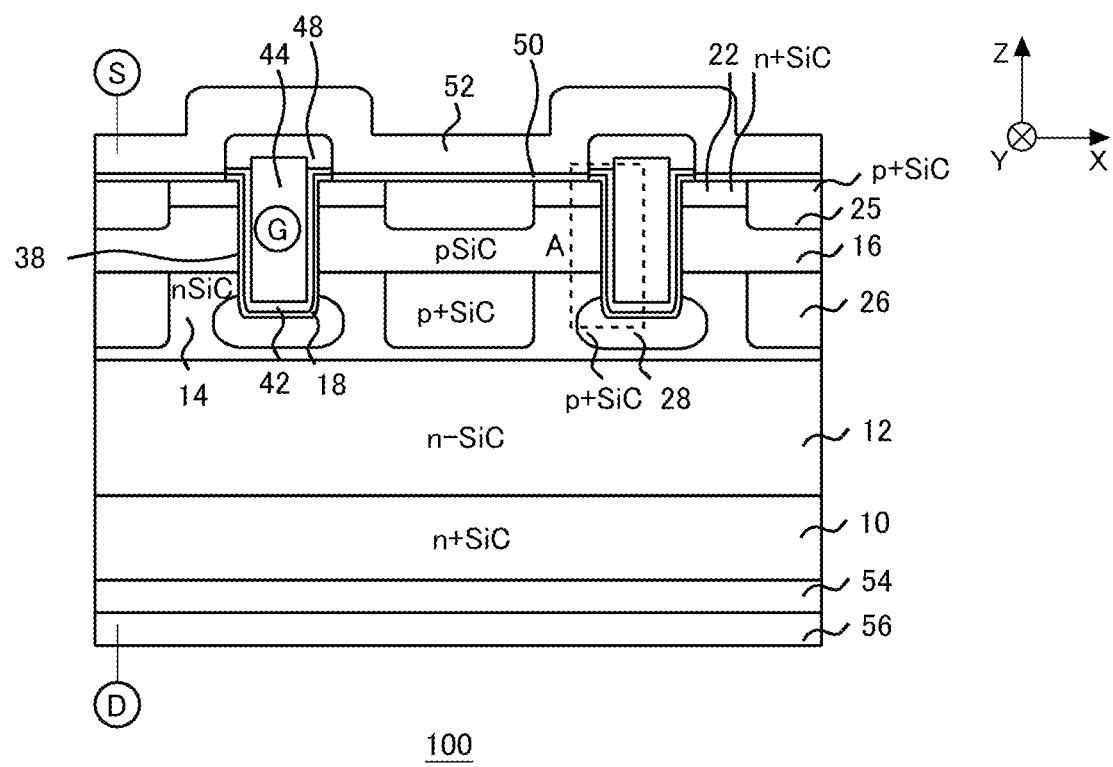
FIG. 1 shows an exemplary configuration of a silicon carbide semiconductor device 100 according to one embodiment of the present invention.

FIG. 1 shows an exemplary configuration of a silicon carbide semiconductor device 100 according to one embodiment of the present invention. The silicon carbide semiconductor device 100 in FIG. 1 is a vertical MOSFET (Metal Oxide Semiconductor Field Effect Transistor). The silicon carbide semiconductor device 100 may have upper and lower faces parallel to an X-Y plane. FIG. 1 shows a cross section taken along an X-Z plane to illustrate a portion of the silicon carbide semiconductor device 100. In this example, the X-axis and Y-axis directions are perpendicular to each other, while the Z-axis direction is perpendicular to the X-Y plane.

In this example, the positive Z-axis direction may be referred to as "upper," and the negative Z-axis direction as "lower."

However, the terms "upper" and "lower" do not necessarily mean the vertical direction to the ground. That is, the "upper" and "lower" directions are not limited to the direction of gravity. The terms "upper" and "lower" are merely convenient expressions to specify the relative positional relationship among substrates, layers, regions, films, and the like.

The structure shown in FIG. 1 may be an array of two unit structures of the vertical MOSFET. Such a unit structure may extend along the Y-axis direction and be provided repeatedly in the X-axis direction. A plurality of unit structures may be arranged to configure a generally rectangular shape as seen in a X-Y plane view. A region provided with the plurality of unit structures may be referred to as an active region. An edge termination structure that functions to prevent electric field concentration in the active region may be provided surrounding the active region. The edge termination structure may include one or more of a guard ring structure, a field plate structure, and a JTE (Junction Termination Extension) structure.

The silicon carbide semiconductor device 100 in this example has a silicon carbide substrate 10. The silicon carbide substrate 10 may be a so-called m-plane silicon carbide substrate. The m-axis direction of the silicon carbide substrate 10 may be parallel to the Z-axis direction. The silicon carbide substrate 10 may be a so-called Si-plane silicon carbide substrate. The Si-axis direction of the silicon carbide substrate 10 may be parallel to the Z-axis direction. The silicon carbide substrate 10 may be a so-called C-plane silicon carbide substrate. The C-axis direction of the silicon carbide substrate 10 may be parallel to the Z-axis direction. The silicon carbide substrate 10 may be a so-called a-plane silicon carbide substrate. The a-axis direction of the silicon carbide substrate 10 may be parallel to the Z-axis direction. The silicon carbide substrate 10 may be a low dislocation free-standing substrate with a threading dislocation density of less than $1 \times 10^7$ cm$^{-2}$. The silicon carbide substrate 10 in this example is an n+ type substrate.

While the conductivity type of the substrate and each layer is described as either of p type and n type in this example, the substrate and each layer may be of the other conductivity type in other examples. The n and p types mean that their majority carrier is electrons and holes, respectively. The positive sign (+) following n or p means that the carrier concentration is higher than that of the same conductivity type without the positive sign, while the negative sign (−) means that the carrier concentration is lower than that of the same conductivity type without the negative sign.

A silicon carbide layer 12 is an n− type silicon carbide layer with a lower impurity concentration than the silicon carbide substrate 10. The silicon carbide layer 12 is a low-concentration n type drift layer. The silicon carbide layer 12 is provided on the upper face of the silicon carbide substrate 10. The silicon carbide layer 12 may be deposited using the epitaxial growth. On a side of the silicon carbide layer 12 opposite to the silicon carbide substrate 10, a high concentration region 14 is formed. The high concentration region 14 is an n type silicon carbide layer with an impurity concentration which is lower than that of the silicon carbide substrate 10 and higher than that of the silicon carbide layer 12. The high concentration region 14 in this example is a high-concentration n type drift layer. The high concentration region 14 may be deposited using the epitaxial growth. On a side of the high concentration region 14 opposite to the silicon carbide layer 12, a base layer 16 is formed. The base layer 16 in this example is of the p type. The base layer 16 may be deposited using the epitaxial growth.

In FIG. 1, a drain electrode 54 is provided on the lower face of the silicon carbide substrate 10. Below the drain electrode 54, a drain electrode pad 56 is provided.

The silicon carbide semiconductor device 100 has a trench structure formed on the upper side. Specifically, a trench 38 extends from the upper face of the base layer 16 opposite to the silicon carbide substrate 10 (the upper face side of the silicon carbide semiconductor device 100), passing through the base layer 16 to the high concentration region 14. The base layer 16 and the high concentration region 14 (i.e., a silicon carbide layer) has the trench 38 formed therein. Along the inner wall of the trench 38, a transition region 18 is formed on the bottom and side wall of the trench 38, while a silicon dioxide layer 42 is formed inside the transition region 18 in the trench 38. That is, the transition region 18 is provided between the silicon carbide layer and the silicon dioxide layer 42. The silicon dioxide layer 42 may be formed using high temperature oxidation (HTO). The transition region 18 will be described in detail below. In addition, a gate electrode 44 is formed inside the silicon dioxide layer 42 in the trench 38. The gate electrode 44 is formed of polysilicon, for example. The silicon dioxide layer 42 insulates the gate electrode 44 from the high concentration region 14 and the base layer 16. A portion of the gate electrode 44 may project from above the trench 38 toward a source electrode pad 52. On the gate electrode 44, an interlayer insulation film 48 may be formed. The interlayer insulation film 48 provides insulation between the gate electrode 44 and the source electrode pad 52.

On the front surface side of the silicon carbide semiconductor device 100, a source region 22 and a contact region 25 are selectively provided. The source region 22 and the contact region 25 may contact a source electrode 50. The source region 22 may also contact the trench 38. In this example, the source region 22 is of the n+ type and the contact region 25 is of the p+ type. The source region 22 and the contact region 25 may be formed by doping.

The high concentration region 14 in this example includes a first base region 26 and a second base region 28 selectively provided therein. The lower end of the first base region 26 is positioned closer to the drain electrode 54 than the bottom of the trench 38. The lower end of the second base region 28 is positioned closer to the drain electrode 54 than the bottom of the trench 38. The second base region 28 is formed at a location facing the bottom of the trench 38 in the depth direction (Z-axis direction). The width of the second base region 28 in the X-axis direction may be wider than the width of the trench 38 in the X-axis direction. The bottom of the trench 38 may reach the second base region 28, or may be positioned in the high concentration region 14 sandwiched between the base layer 16 and the second base region 28 without contacting the second base region 28. In this example, the bottom of the trench 38 reaches the second base region 28. In this example, the first base region 26 and the second base region 28 are of the p+ type. The first base region 26 and the second base region 28 are doped with aluminum element, for example.

By applying a predetermined positive potential to the gate electrode 44, a charge-reversed region (i.e., a channel) is formed in the base layer 16. When a predetermined potential difference is created between the source electrode 50 (source electrode pad 52) and the drain electrode 54 (drain electrode pad 56), an electron current flows from the source electrode 50 to the drain electrode 54 via the channel.

Figure 2:
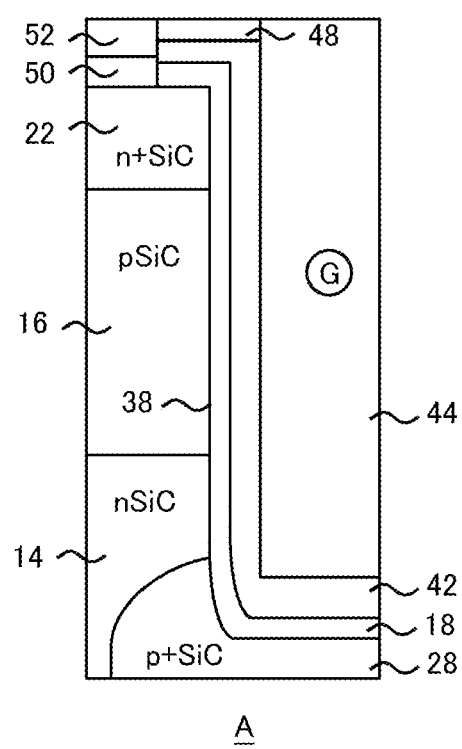
FIG. 2 shows a configuration of the silicon carbide semiconductor device 100 in a region A.

FIG. 2 shows a configuration of the silicon carbide semiconductor device 100 in a region A. The region A shows the silicon dioxide layer 42, the base layer 16, and the high concentration region 14 in the vicinity of the trench 38.

The transition region 18 is provided between the silicon dioxide layer 42 and the silicon carbide layer (the base layer 16 and the high concentration region 14). The transition region 18 contains oxygen and carbon. The transition region 18 also contains nitrogen, because it is heat-treated in an NO gas atmosphere as described below. In this example, the transition region 18 contains nitrogen, allowing reduction in defects in the transition region 18 (at the interface between the silicon carbide layer and the silicon dioxide layer 42). Accordingly, the field-effect mobility can be increased and electric characteristics of the silicon carbide semiconductor device 100 can be improved. For analyzing the transition region 18 herein, a sample was made using the same method of forming the transition region 18 of the silicon carbide semiconductor device 100.

Figure 3:
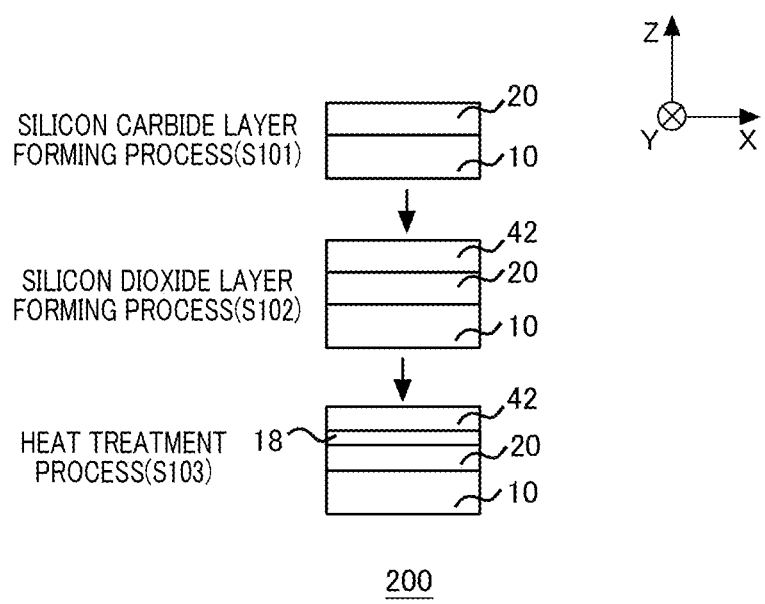
FIG. 3 shows an exemplary method of forming a sample 200.

FIG. 3 shows an exemplary method of forming a sample 200. The sample 200 comprises the silicon carbide substrate 10, a silicon carbide layer 20, the silicon dioxide layer 42, and the transition region 18. The silicon carbide layer 20 is identical with either the base layer 16 or the high concentration region 14. First, a silicon carbide layer forming process S101 is performed to form the silicon carbide layer 20 on the silicon carbide substrate 10 (S101). The silicon carbide layer 20 in this example has a thickness of 3 μm or more and 7 μm or less (e.g., 5 μm). The silicon carbide layer forming process S101 may be performed using the epitaxial growth. Before the silicon carbide layer forming process S101 is performed, the silicon carbide substrate 10 is preferably cleaned using the RCA cleaning or the like.

Next, a silicon dioxide layer forming process S102 is performed to form the silicon dioxide layer 42 on the silicon carbide layer 20 (S102). The silicon dioxide layer 42 in this example has a thickness of 30 nm or more (e.g., 60 nm). The silicon dioxide layer forming process S102 may be performed using high temperature oxidation (HTO). The high temperature oxidation may be performed by introducing dichlorosilane and $N_2O$ into a chamber in which the silicon carbide substrate 10 is mounted. The processing temperature of the high temperature oxidation is 800° C. as an example. The silicon dioxide layer forming process S102 may be performed using other known methods.

After the silicon dioxide layer 42 is formed, a heat treatment process S103 is performed to conduct a heat treatment (S103). The heat treatment process S103 may be performed in a gas atmosphere containing 90% of $N_2$ gas and 10% of NO gas. The processing temperature of the heat treatment process may be 1300° C. or higher and 1500° C. or lower. The processing temperature of the heat treatment process S103 may be 1350° C. or higher. The processing temperature of the heat treatment process S103 in this example is 1300° C. The processing time of the heat treatment process S103 in this example is 15 minutes or more and 45 minutes or less (e.g., 30 minutes). By increasing the processing temperature and extending the processing time, the transition region 18 can be formed efficiently. With the heat treatment process S103, the transition region 18 is formed. In addition, with the heat treatment process S103, nitrogen derived from NO gas accumulates in the transition region 18. Nitrogen accumulating in the transition region 18 reduces defects in the transition region 18. Since nitrogen is introduced from the silicon dioxide layer 42, the silicon dioxide layer 42 contains nitrogen.

Figure 4:
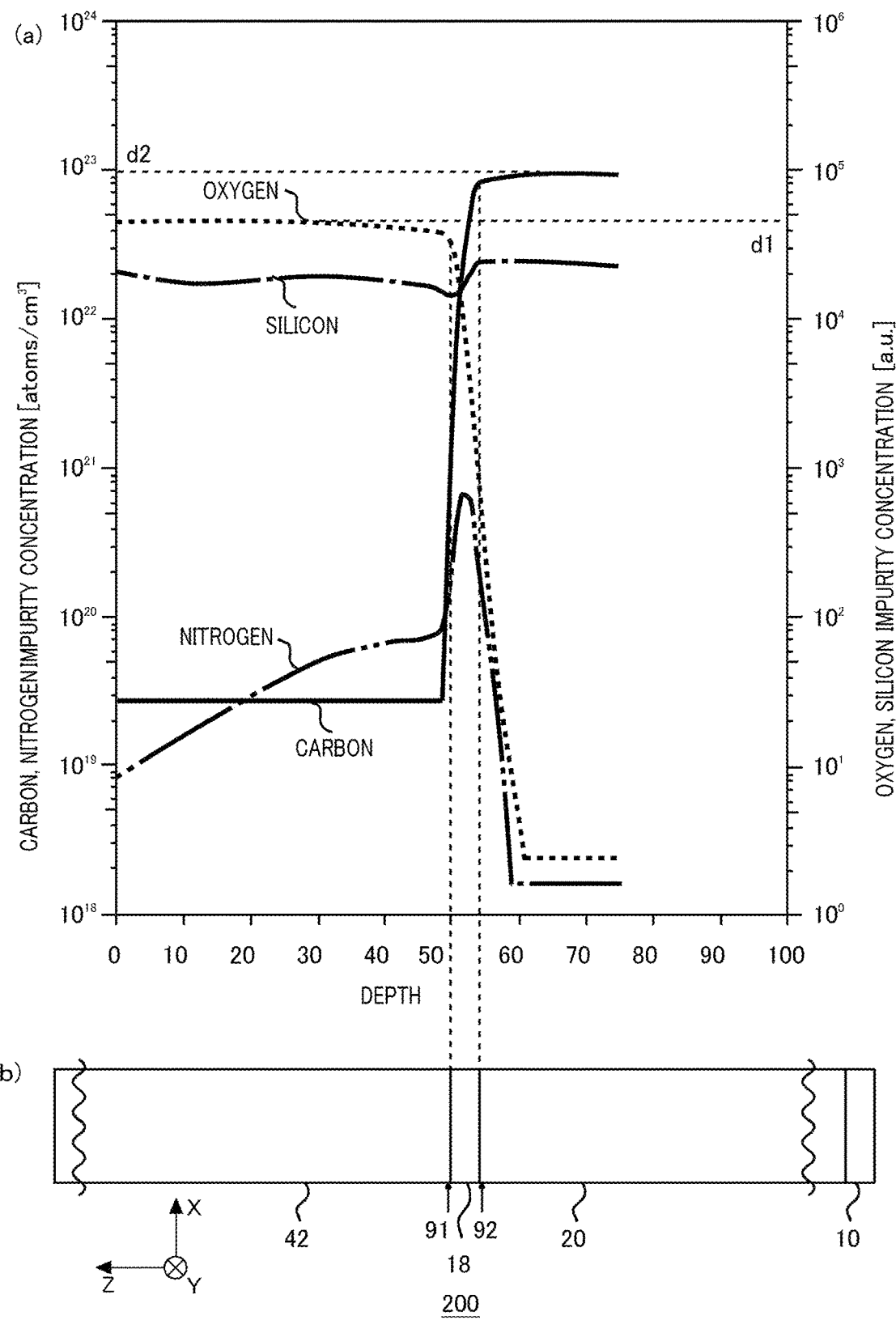
FIG. 4 is an exemplary concentration profile obtained from the SIMS analysis in the vicinity of a transition region 18 of the sample 200.

FIG. 4 is an exemplary concentration profile obtained from the SIMS analysis in the vicinity of the transition region 18 of the sample 200. FIG. 4(a) shows the concentration profile in the vicinity of the transition region 18. The vicinity of the transition region 18 means a part of the silicon dioxide layer 42 as well as a part of the transition region 18 and the silicon carbide layer 20. FIG. 4(a) shows the impurity concentrations of carbon, nitrogen, oxygen, and silicon. In FIG. 4(a), the abscissa denotes a depth (depth in the Z-axis direction in FIG. 4(b)).

FIG. 4(b) shows a layered structure in the vicinity of the transition region 18 of the sample 200. In FIG. 4(b), the length in the depth direction is partially omitted for a region which is not illustrated in FIG. 4(a).

Referring to FIG. 4(a), the oxygen concentration in the silicon dioxide layer 42 exhibits a generally constant impurity concentration d1. The oxygen concentration begins to decrease monotonously as proceeding from the silicon dioxide layer 42 into the transition region 18, and exhibits a constant impurity concentration in the silicon carbide layer 20. The carbon concentration in the silicon carbide layer 20 exhibits a generally constant impurity concentration d2. The carbon concentration begins to decrease monotonously as proceeding from the silicon carbide layer 20 into the transition region 18, and exhibits a constant impurity concentration in the silicon dioxide layer 42.

The transition region 18 may correspond to a region from the point where the oxygen concentration in the silicon dioxide layer 42 begins to decrease as proceeding from the silicon dioxide layer 42 toward the silicon carbide layer 20 to the point where the carbon concentration in the silicon carbide layer 20 begins to decrease as proceeding from the silicon carbide layer 20 toward the silicon dioxide layer 42. The point where the oxygen concentration in the silicon dioxide layer 42 begins to decrease may be the point where the oxygen concentration becomes 95%, or 90% or less, of the maximum oxygen concentration in the silicon dioxide layer 42. In FIG. 4(a), the X-Y plane at such a point is stated as a first plane 91. The maximum oxygen concentration in the silicon dioxide layer 42 may be the impurity concentration d1.

Similarly, the point where the carbon concentration in the silicon carbide layer 20 begins to decrease may be the point where the carbon concentration becomes 95% or less, or the point where the carbon concentration becomes 90% or less, of the maximum carbon concentration in the silicon carbide layer 20. In FIG. 4(a), the X-Y plane at such a point is stated as a second plane 92. The maximum carbon concentration in the silicon carbide layer 20 may be the impurity concentration d2. The silicon concentration begins to decrease monotonously as reaching the transition region 18, and exhibits a constant impurity concentration in the silicon dioxide layer 42.

As described above, the transition region 18 is arranged between the silicon carbide layer 20 and the silicon dioxide layer 42. The transition region 18 contains carbon, oxygen, and nitrogen. The transition region 18 can be formed by depositing the silicon dioxide layer 42 on the silicon carbide layer 20 and applying the heat treatment.

The nitrogen concentration in the transition region 18 has a peak. It results from the heat treatment process S103 that accumulates nitrogen derived from NO gas in the transition region 18. In this example, the maximum nitrogen concentration in the transition region 18 is $1.0 \times 10^{20}$ cm$^{-3}$ or higher. Since the maximum nitrogen concentration in the transition region 18 is $1.0 \times 10^{20}$ cm$^{-3}$ or higher, defects in the transition region 18 can be further reduced.

The maximum nitrogen concentration in the transition region 18 may be higher than the maximum nitrogen concentration in the silicon dioxide layer 42. In this example, the maximum nitrogen concentration in the transition region 18 is five or more times higher than the maximum nitrogen concentration in the silicon dioxide layer 42. The silicon dioxide layer 42 exhibits the maximum nitrogen concentration on the second plane 92. The transition region 18 contains more unbonded hands (dangling bonds) than in the silicon dioxide layer 42. Thus, many dangling bonds in the transition region 18 are bonded to nitrogen, resulting in the maximum nitrogen concentration in the transition region 18 higher than the maximum nitrogen concentration in the silicon dioxide layer 42.

The maximum nitrogen concentration in the silicon dioxide layer 42 may be higher than the maximum nitrogen concentration in the silicon carbide layer 20. That is, the nitrogen concentration on the second plane 92 may be higher than the nitrogen concentration on the first plane 91. Nitrogen is supplied from the silicon dioxide layer 42 side, resulting in the maximum nitrogen concentration in the silicon dioxide layer 42 being higher than the maximum nitrogen concentration in the silicon carbide layer 20.

The transition region 18 may have a thickness of 3 nm or more. The transition region 18 having a thickness of 3 nm or more allows accumulation of a sufficient amount of nitrogen therein. The transition region 18 may have a thickness of 5 nm or less. The transition region 18 having a thickness of 5 nm or less allows preventing deterioration of the electric characteristics. In this example, the transition region 18 has a thickness of 4 nm. A full width at half maximum of the maximum nitrogen concentration in the transition region 18 may be 1.0 nm or less. By narrowing the full width at half maximum of the maximum nitrogen concentration in the transition region 18, the thickness of the transition region 18 can be made 5 nm or less.

Figure 5:
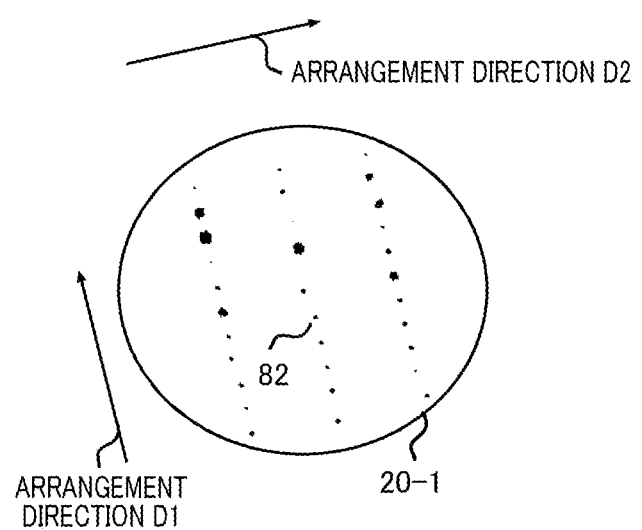
FIG. 5 is an exemplary result of the LEED analysis on a silicon carbide layer 20.

FIG. 5 is an exemplary result of the LEED analysis on the silicon carbide layer 20. In FIG. 5, the LEED analysis is conducted on the surface of the silicon carbide layer 20 of the sample 200 after the silicon carbide layer forming process S101 is performed. The silicon carbide layer 20 of the sample 200 after the silicon carbide layer forming process S101 is denoted as a silicon carbide layer 20-1. The LEED analysis represents the Low Energy Electron Diffraction. In FIG. 5, the image is binarized black and white with a certain threshold. FIG. 5 shows a certain region of the silicon carbide layer 20-1.

In FIG. 5, spots (black spots in FIG. 5) are arranged at a constant spacing. Thus, the LEED analysis can determine that the silicon carbide layer 20-1 has a crystalline structure. Whether the spots are arranged at a constant spacing may be determined, for example, by determining whether the respective spots arranged in the arrangement direction of the spots in FIG. 5 are identifiable. The arrangement direction corresponds to the direction along which at least three or more spots are arranged. In the example in FIG. 5, the arrangement direction may be either D1 or D2. In the example in FIG. 5, spots 82 may be identifiable as long as each spot arranged in the arrangement direction D1 is visible as a black spot. When the black spots are identifiable, the silicon carbide layer 20-1 may be determined to be of a crystalline structure.

Figure 6:
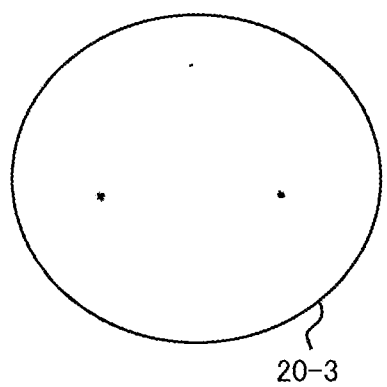
FIG. 6 shows an exemplary result of the LEED analysis on the silicon carbide layer 20 that is heat-treated with NO gas.

FIG. 6 shows an exemplary result of the LEED analysis on the silicon carbide layer 20 that is heat-treated with NO gas. In FIG. 6, after only the silicon dioxide layer 42 is removed by HF (hydrogen fluoride) from the sample 200 after the heat treatment process S103 is performed, the LEED analysis is conducted on the surface of the silicon carbide layer 20 having the silicon dioxide layer 42 removed. The silicon carbide layer 20 of the sample 200 after the heat treatment process S103 is performed is denoted as a silicon carbide layer 20-3. In FIG. 6, the image is also binarized black and white with a certain threshold.

In FIG. 6, as compared to those in FIG. 5, the spots are not arranged with a constant spacing so that the arrangement of black spots is not identifiable. In FIG. 6, the arrangement direction cannot be defined. Thus, in FIG. 6, it can be determined that the spots are not arranged at a constant spacing. Accordingly, in FIG. 6, the LEED analysis can determine that the silicon carbide layer 20 includes irregularity in the crystalline arrangement. That is, the silicon carbide layer 20-3 after the heat treatment with NO gas exhibits strain.

Figure 7:
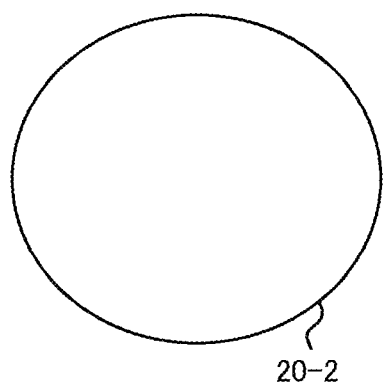
FIG. 7 shows an exemplary result of the LEED analysis on the silicon carbide layer 20 after formation of a silicon dioxide layer 42.

FIG. 7 shows an exemplary result of the LEED analysis on the silicon carbide layer 20 after the formation of the silicon dioxide layer 42. In FIG. 7, after only the silicon dioxide layer 42 is removed by HF (hydrogen fluoride) from the sample 200 after the silicon dioxide layer forming process S102 is performed, the LEED analysis is conducted on the surface of the silicon carbide layer 20 having the silicon dioxide layer 42 removed from the. The silicon carbide layer 20 of the sample 200 after the silicon dioxide layer forming process S102 is performed is denoted as a silicon carbide layer 20-2. In FIG. 7, the image is also binarized black and white with a certain threshold.

In FIG. 7, no spot is observed. Thus, it can be determined that, after the silicon dioxide layer 42 is formed, the surface of the silicon carbide layer 20-2 is amorphized.

Figure 8:
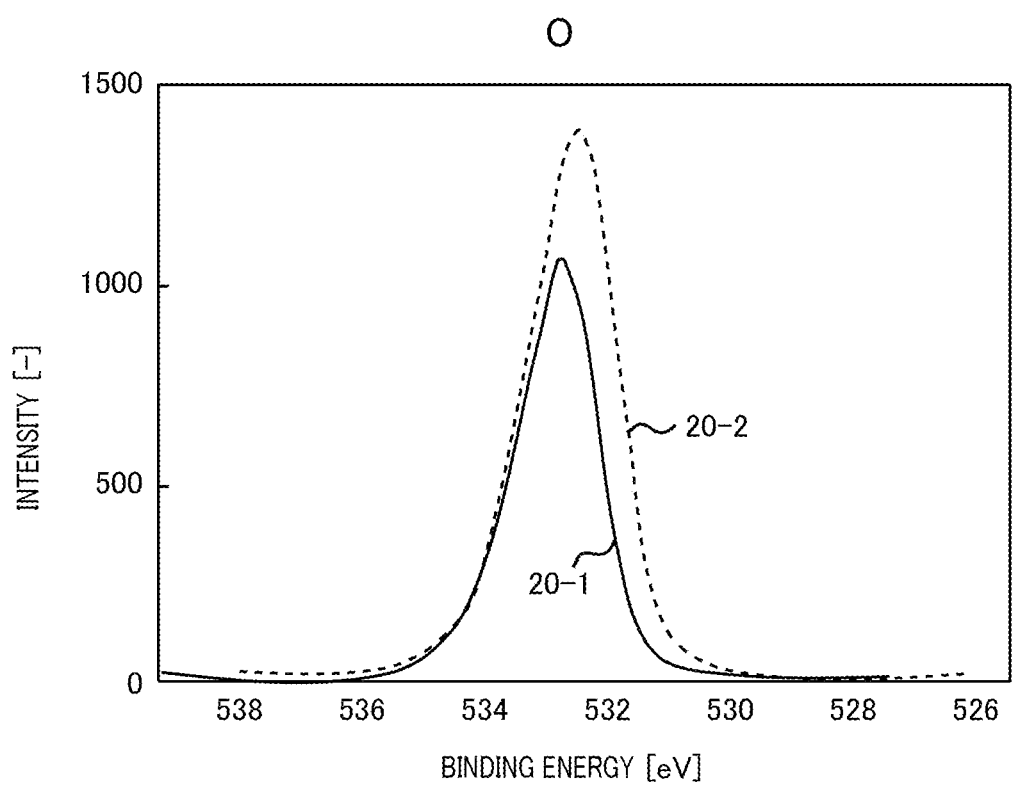
FIG. 8 shows an exemplary result of the XPS analysis on the silicon carbide layer 20 for oxygen.

FIG. 8 shows an exemplary result of the XPS analysis on the silicon carbide layer 20 for oxygen. FIG. 8 shows the results for the silicon carbide layer 20-1 (FIG. 5) and the silicon carbide layer 20-2 (FIG. 7). The XPS represents the X-ray Photoelectron Spectroscopy.

In FIG. 8, the silicon carbide layer 20-2 shows a higher peak than the silicon carbide layer 20-1. Thus, performing the silicon dioxide layer forming process S102 can keep oxygen left on the surface of the silicon carbide layer 20-2.

Figure 9:
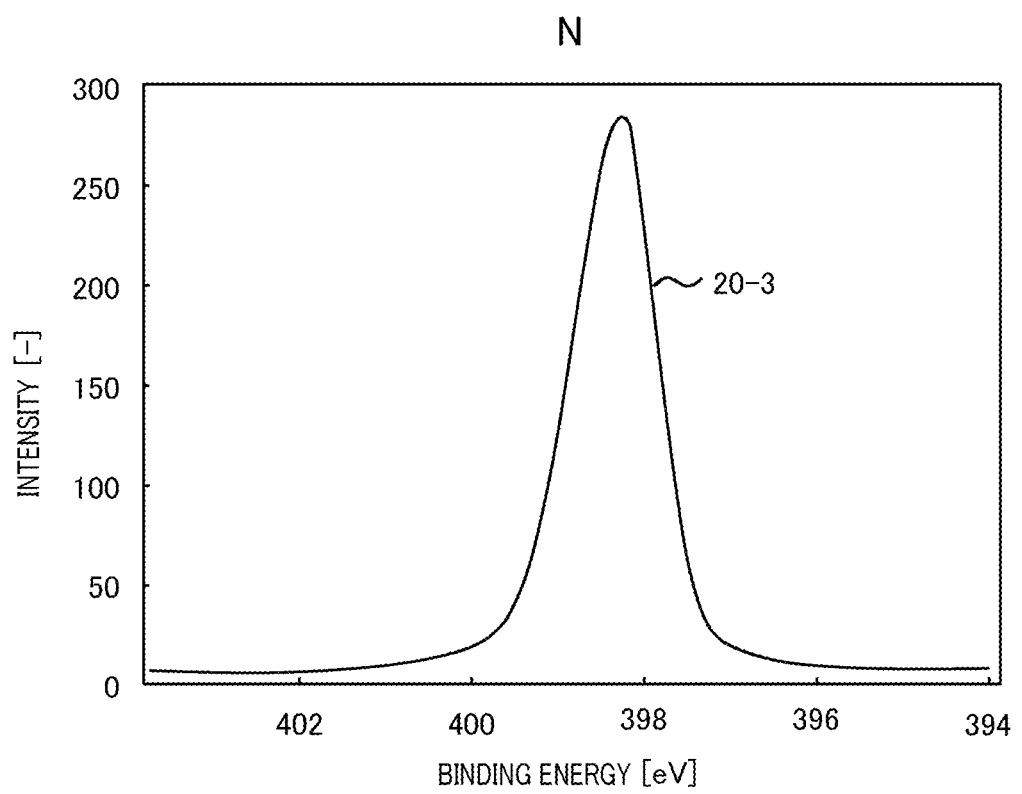
FIG. 9 shows an exemplary result of the XPS analysis on the silicon carbide layer 20 for nitrogen.

FIG. 9 shows an exemplary result of the XPS analysis on the silicon carbide layer 20 for nitrogen. FIG. 9 shows the result for the silicon carbide layer 20-3 (FIG. 6).

In FIG. 9, the silicon carbide layer 20-3 has a nitrogen peak. Thus, performing the heat treatment process S103 can keep nitrogen present on the silicon carbide layer 20-3.

Figure 10:
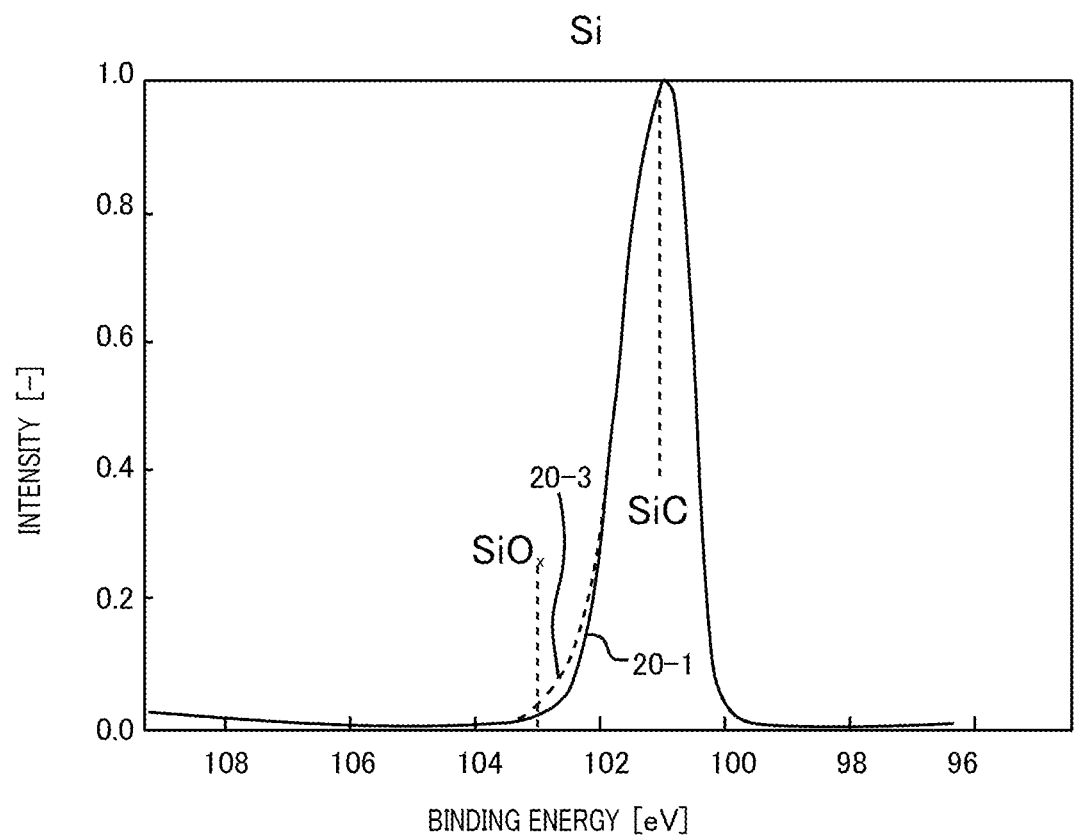
FIG. 10 shows an exemplary result of the XPS analysis on the silicon carbide layer 20 for silicon.

FIG. 10 shows an exemplary result of the XPS analysis on the silicon carbide layer 20 for silicon. FIG. 10 shows the results for the silicon carbide layer 20-1 (FIG. 5) and the silicon carbide layer 20-3 (FIG. 6).

In FIG. 10, the silicon carbide layer 20-1 and the silicon carbide layer 20-3 each has a silicon carbide peak. The silicon carbide layer 20-3 has a higher peak of imperfect silicon dioxide (SiOx) than the silicon carbide layer 20-1. From the above, it can be determined that the silicon carbide layer 20-3 contains a larger amount of imperfect silicon dioxide as compared to the silicon carbide layer 20-1.

Figure 11:
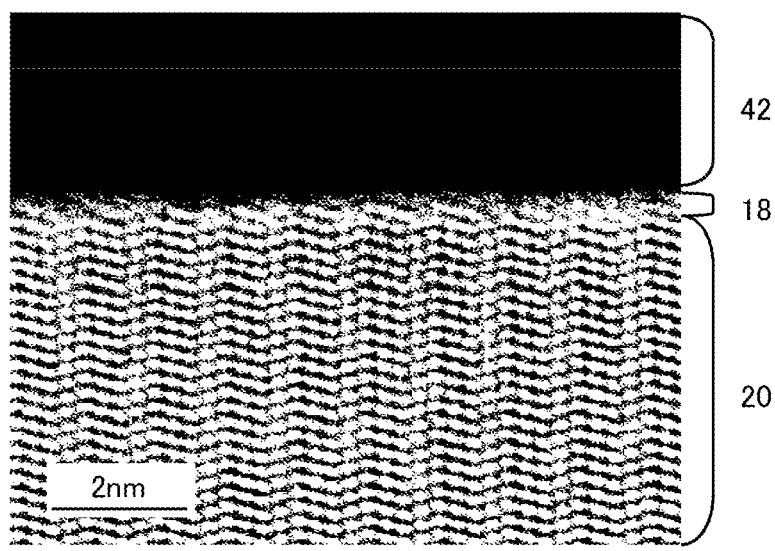
FIG. 11 shows a transmission electron microscopic image taken in the vicinity of the transition region 18.

FIG. 11 shows a transmission electron microscopic image taken in the vicinity of the transition region 18. In FIG. 11, the vicinity of the transition region 18 means a part of the silicon dioxide layer 42 as well as a part of the transition region 18 and the silicon carbide layer 20. In FIG. 11, the image is binarized black and white with a fixed threshold.

In FIG. 11, the transition region 18 may be a region including irregularity in the crystalline arrangement. The crystalline irregularity may be defined by the contrast. That is, a region with an unclear contrast may be defined as the transition region 18. In FIG. 11, the transition region 18 is a region having an unclear contrast of black and white.

Figure 12:
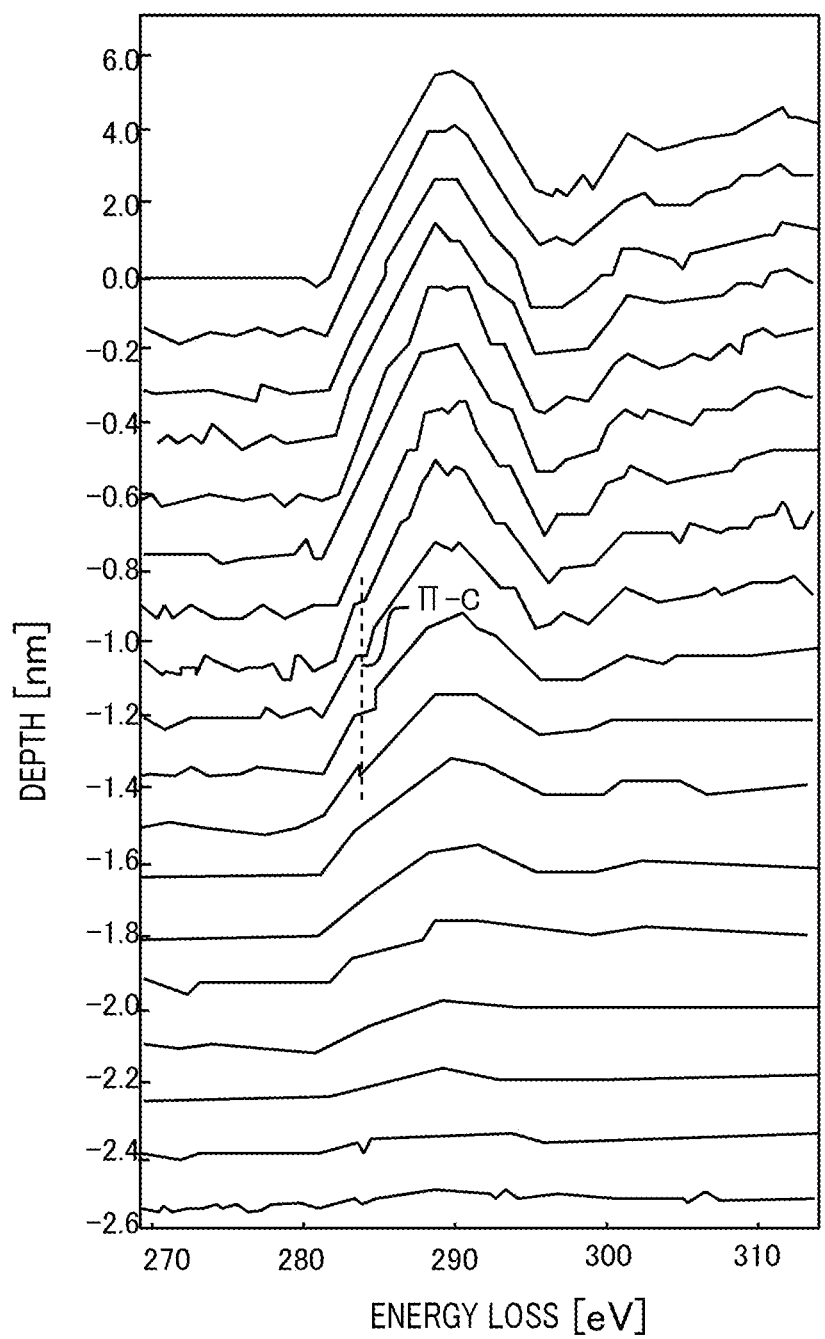
FIG. 12 shows a result of the EELS analysis on the transition region 18.

FIG. 12 shows a result of the EELS analysis on the transition region 18. The EELS represents the Electron Energy Loss Spectroscopy. In FIG. 12, the abscissa denotes an energy loss and the ordinate denotes a depth. In the example in FIG. 12, the spectra of the depth positions between −1.0 nm and −1.6 nm each has a peak of π-C bond. Accordingly, it can be determined that the transition region 18 is contaminated with an excess amount of carbon.

Figure 13:
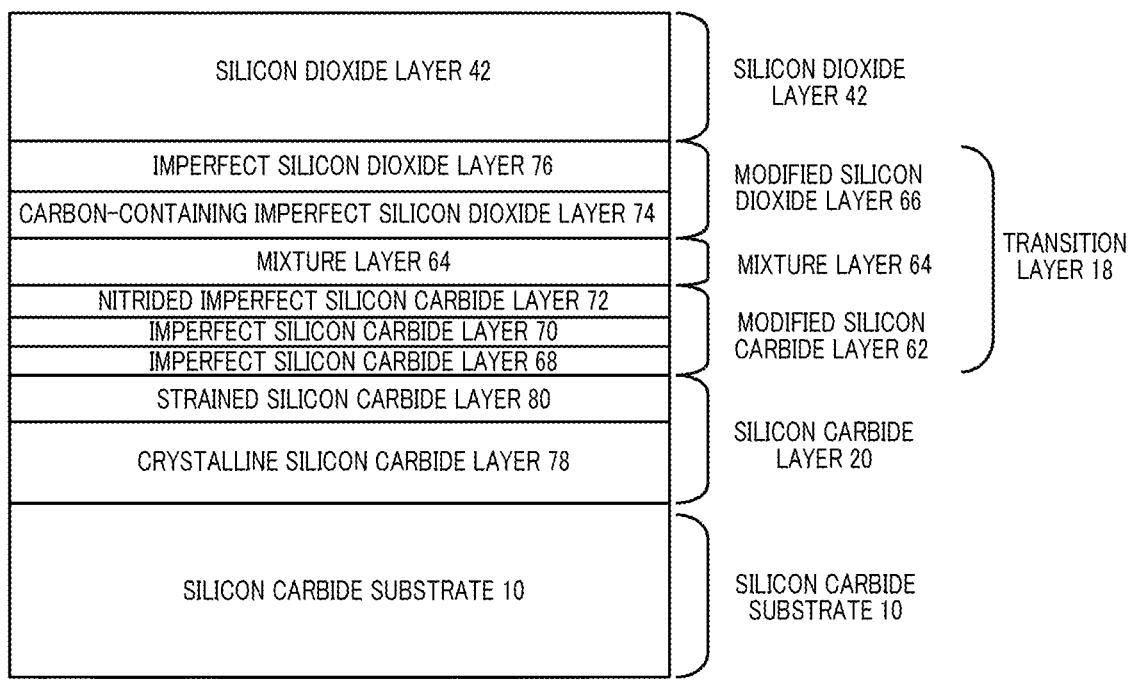
FIG. 13 shows in detail a layered structure of the transition region 18.

FIG. 13 shows in detail a layered structure of the transition region 18. The transition region 18 has a modified silicon dioxide layer 66, a mixed layer 64, and a modified silicon carbide layer 62. The modified silicon dioxide layer 66 is provided below the silicon dioxide layer 42. The mixed layer 64 is provided below the modified silicon dioxide layer 66. The modified silicon carbide layer 62 is provided below the mixed layer 64.

The modified silicon dioxide layer 66, the mixed layer 64, and the modified silicon carbide layer 62 can be discriminated using the SIMS analysis. The maximum carbon concentration is higher in the order of the modified silicon carbide layer 62, the mixed layer 64, and the modified silicon dioxide layer 66. The maximum oxygen concentration is higher in the order of the modified silicon dioxide layer 66, the mixed layer 64, and the modified silicon carbide layer 62. The maximum nitrogen concentration is higher in the order of the mixed layer 64, the modified silicon dioxide layer 66, and the modified silicon carbide layer 62. In this manner, the SIMS analysis, the XPS analysis or the like can be used to discriminate the modified silicon dioxide layer 66, the mixed layer 64, and the modified silicon carbide layer 62.

The modified silicon carbide layer 62 may have a nitrided imperfect silicon carbide layer 72, an imperfect silicon carbide layer 70, and an amorphous silicon carbide layer 68. The nitrided imperfect silicon carbide layer 72 may be provided below the mixed layer 64. The imperfect silicon carbide layer 70 may be provided below the nitrided imperfect silicon carbide layer 72. The imperfect silicon carbide layer 70 may not contain nitrogen. The amorphous silicon carbide layer 68 may be provided below the imperfect silicon carbide layer 70. The amorphous silicon carbide layer 68 may not contain oxygen. The SIMS analysis, the XPS analysis, the EELS analysis or the like can be used to discriminate the nitrided imperfect silicon carbide layer 72, the imperfect silicon carbide layer 70, and the amorphous silicon carbide layer 68. Whether a layer is amorphous may be determined using the LEED analysis or transmission electron microscopes.

The modified silicon dioxide layer 66 may have a carbon-containing imperfect silicon dioxide layer 74 and an imperfect silicon dioxide layer 76. The carbon-containing imperfect silicon dioxide layer 74 may be provided above the mixed layer 64. The imperfect silicon dioxide layer 76 may be provided above the carbon-containing imperfect silicon dioxide layer 74. The imperfect silicon dioxide layer 76 may not contain carbon. The SIMS analysis, the XPS analysis or the like can be used to discriminate the carbon-containing imperfect silicon dioxide layer 74 and the imperfect silicon dioxide layer 76.

The silicon carbide layer 20 may have a strained silicon carbide layer 80 and a crystalline silicon carbide layer 78. The strained silicon carbide layer 80 may be provided below the transition region 18. The strained silicon carbide layer 80 may be defined using the LEED analysis. That is, as shown in FIG. 6, the LEED analysis may be used to determine whether the spots are arranged at a constant spacing to discriminate the strained silicon carbide layer 80. The crystalline silicon carbide layer 78 may be provided below the strained silicon carbide layer 80.

Figure 14:
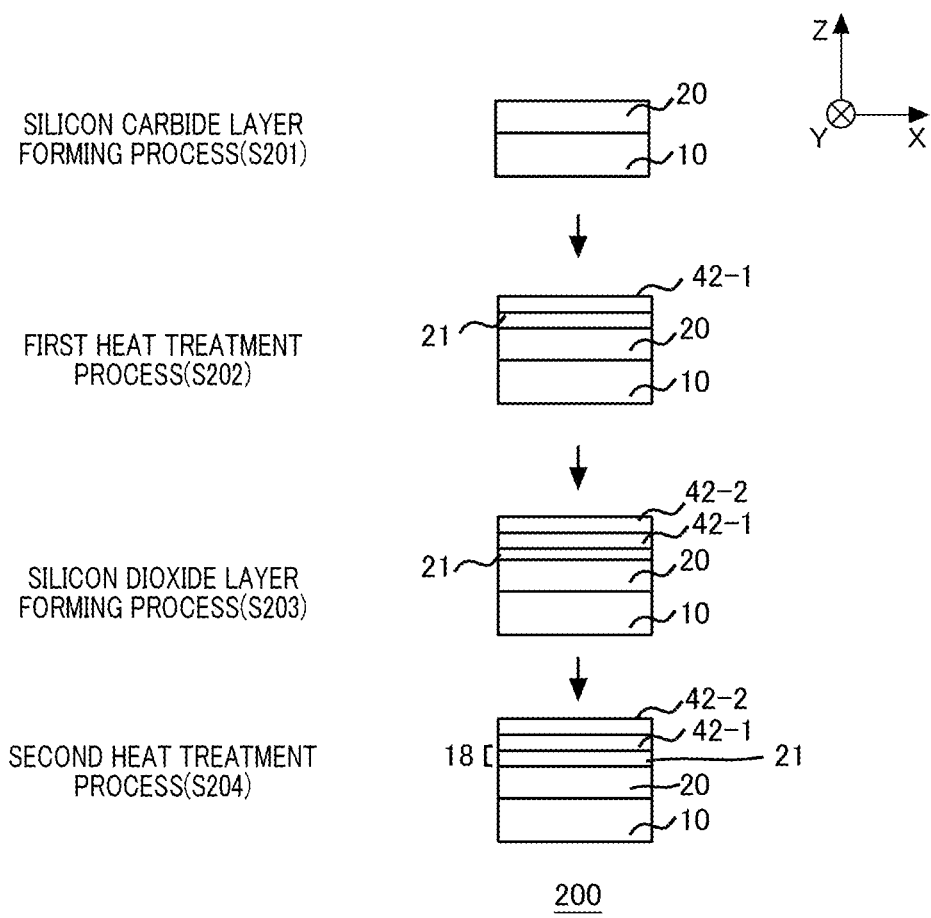
FIG. 14 shows another exemplary method of forming the sample 200.

FIG. 14 shows another exemplary method of forming the sample 200. First, a silicon carbide layer forming process S201 is performed to form the silicon carbide layer 20 on the silicon carbide substrate 10 (S201). The silicon carbide layer forming process S201 may be identical with the silicon carbide layer forming process S101 in FIG. 3.

Next, a first heat treatment process S202 is performed (S202). The processing temperature of the first heat treatment process S202 may be 1200° C. or higher and lower than 1300° C. The first heat treatment process S202 may be performed in a gas atmosphere containing 90% of $N_2$ gas and 10% of NO gas. The processing time of the first heat treatment process S202 in this example is between 5 minutes or more and 10 minutes or less. The first heat treatment process S202 forms a nitride layer 21 above the silicon carbide layer 20. Above the nitride layer 21, a silicon dioxide layer 42-1 is formed. The silicon dioxide layer 42-1 has a thickness of 1 nm or less, for example. Since the silicon dioxide layer 42-1 is provided, a silicon dioxide layer forming process S203 and a second heat treatment process S204 can involve less oxidation.

After forming the nitride layer 21 and the silicon dioxide layer 42-1, the silicon dioxide layer forming process S203 is performed. The silicon dioxide layer forming process S203 may be performed using high temperature oxidation (HTO). The high temperature oxidation may be performed by introducing dichlorosilane and $N_2O$. The processing temperature of the high temperature oxidation is 800° C. as an example. The high temperature oxidation may be performed by introducing monosilane instead of dichlorosilane. The silicon dioxide layer forming process S203 forms a silicon dioxide layer 42-2. The silicon dioxide layer 42-2 has a thickness of 2 nm, for example. The silicon dioxide layer forming process S203 removes nitrogen from the nitride layer 21.

After the silicon dioxide layer forming process S203, the second heat treatment process S204 is performed (S204).

The processing temperature of the second heat treatment process S204 may be 50° C. or more higher than the processing temperature of the first heat treatment process S202. As an example, the processing temperature of the second heat treatment process S204 may be 100° C. higher than the processing temperature of the first heat treatment process S202. The processing temperature of the second heat treatment process S204 may be between 1300° C. or higher and 1330° C. or lower. The second heat treatment process S204 may be performed in a gas atmosphere containing 90% of $N_2$ gas and 10% of NO gas. The processing time of the second heat treatment process S204 in this example is between 5 minutes or more and 15 minutes or less. The total processing time of the first heat treatment process S202 and the second heat treatment process S204 is preferably 30 minutes or less. Setting the processing temperature of the second heat treatment process S204 higher than that of the first heat treatment process S202 allows introducing a sufficient amount of nitrogen into the nitride layer 21 to reduce defects on the interface of the silicon carbide layer 20. The second heat treatment process S204 forms the transition region 18 in the vicinity of the interface of the silicon carbide layer 20. The transition region 18 may include the nitride layer 21.

The gas atmosphere of the first heat treatment process S202 may be different from that of the second heat treatment process S204. For example, the first heat treatment process S202 is performed in the gas atmosphere containing 92% of $N_2$ gas and 8% of NO gas, while the second heat treatment process S204 in the gas atmosphere containing 88% of $N_2$ gas and 12% of NO gas.

While the embodiments of the present invention have been described, the technical scope of the invention is not limited to the above described embodiments. It is apparent to persons skilled in the art that various alterations and improvements can be added to the above-described embodiments.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A silicon carbide semiconductor device comprising:
a silicon carbide layer;
a silicon dioxide layer provided above the silicon carbide layer and containing nitrogen; and
a transition region arranged between the silicon carbide layer and the silicon dioxide layer, and containing carbon, oxygen, and nitrogen,
wherein the maximum nitrogen concentration in the transition region is $1.0 \times 10^{20}$ cm$^{-3}$ or higher, and
wherein the maximum nitrogen concentration in the silicon dioxide layer is higher than the maximum nitrogen concentration in the silicon carbide layer.

2. The silicon carbide semiconductor device according to claim 1, wherein the maximum nitrogen concentration in the transition region is five times the maximum nitrogen concentration in the silicon dioxide layer or higher.

3. The silicon carbide semiconductor device according to claim 2, wherein a full width at half maximum of the maximum nitrogen concentration in the transition region is 1.0 nm or less.

4. The silicon carbide semiconductor device according to claim 2, wherein the transition region has a thickness of 3 nm or more.

5. The silicon carbide semiconductor device according to claim 2, wherein the transition region has a thickness of 5 nm or less.

6. The silicon carbide semiconductor device according to claim 2, wherein the silicon carbide layer has:
a strained silicon carbide layer provided below the transition region and defined using LEED analysis; and
a crystalline silicon carbide layer provided below the strained silicon carbide layer.

7. The silicon carbide semiconductor device according to claim 2, wherein:
the transition region has:
a modified silicon dioxide layer provided below the silicon dioxide layer;
a mixed layer provided below the modified silicon dioxide layer; and
a modified silicon carbide layer provided below the mixed layer,
and wherein
the maximum carbon concentration is higher in the order of the modified silicon carbide layer, the mixed layer, and the modified silicon dioxide layer,
the maximum oxygen concentration is higher in the order of the modified silicon dioxide layer, the mixed layer, and the modified silicon carbide layer,
the maximum nitrogen concentration is higher in the order of the mixed layer, the modified silicon dioxide layer, and the modified silicon carbide layer.

8. The silicon carbide semiconductor device according to claim 2, wherein:
the silicon carbide layer has a trench provided therein, and the silicon dioxide layer is formed in the trench.

9. The silicon carbide semiconductor device according to claim 1, wherein a full width at half maximum of the maximum nitrogen concentration in the transition region is 1.0 nm or less.

10. The silicon carbide semiconductor device according to claim 1, wherein the transition region has a thickness of 3 nm or more.

11. The silicon carbide semiconductor device according to claim 1, wherein the transition region has a thickness of 5 nm or less.

12. The silicon carbide semiconductor device according to claim 1, wherein the silicon carbide layer has:
a strained silicon carbide layer provided below the transition region and defined using LEED analysis; and
a crystalline silicon carbide layer provided below the strained silicon carbide layer.

13. The silicon carbide semiconductor device according to claim 1, wherein:
the transition region has:
a modified silicon dioxide layer provided below the silicon dioxide layer;
a mixed layer provided below the modified silicon dioxide layer; and
a modified silicon carbide layer provided below the mixed layer,
and wherein the maximum carbon concentration is higher in the order of the modified silicon carbide layer, the mixed layer, and the modified silicon dioxide layer, the maximum oxygen concentration is higher in the order of the modified silicon dioxide layer, the mixed layer, and the modified silicon carbide layer, the maximum nitrogen concentration is higher in the order of the mixed layer, the modified silicon dioxide layer, and the modified silicon carbide layer.

14. The silicon carbide semiconductor device according to claim 13, wherein:

the modified silicon carbide layer has:

a nitrided imperfect silicon carbide layer provided below the mixed layer;

an imperfect silicon carbide layer provided below the nitrided imperfect silicon carbide layer and not containing nitrogen; and an amorphous silicon carbide layer provided below the imperfect silicon carbide layer and not containing oxygen, and wherein:

the modified silicon dioxide layer has:

a carbon-containing imperfect silicon dioxide layer provided above the mixed layer; and an imperfect silicon dioxide layer provided above the carbon-containing imperfect silicon dioxide layer and not containing carbon.

15. The silicon carbide semiconductor device according to claim 1, wherein:

the silicon carbide layer has a trench provided therein, and the silicon dioxide layer is formed in the trench.

16. A silicon carbide semiconductor device comprising:

a silicon carbide layer;

a silicon dioxide layer provided above the silicon carbide layer and containing nitrogen; and a transition region arranged between the silicon carbide layer and the silicon dioxide layer, and containing carbon, oxygen, and nitrogen, wherein the maximum nitrogen concentration in the transition region is $1.0 \times 10^{20}$ cm$^{-3}$ or higher, and wherein a concentration of the nitrogen is higher than a concentration of carbon in a lower side of the silicon dioxide layer, and the concentration of the carbon is higher than the concentration of the nitrogen in an upper side of the silicon dioxide layer.

* * * * *